United States Patent [19]
Seki et al.

[11] Patent Number: 5,506,552
[45] Date of Patent: Apr. 9, 1996

[54] SURFACE ACOUSTIC WAVE FILTER WITH MULTIPLE GROUND TERMINALS

[75] Inventors: Shun-ichi Seki, Osaka; Kazuo Eda, Nara; Yutaka Taguchi, Ibaraki; Keiji Onishi, Osaka, all of Japan

[73] Assignee: Matsushita Electric Industrial Co., Ltd., Osaka, Japan

[21] Appl. No.: 334,673

[22] Filed: Nov. 4, 1994

[30] Foreign Application Priority Data

Nov. 5, 1993 [JP] Japan ................... 5-276406

[51] Int. Cl.⁶ ................................. H03H 9/64
[52] U.S. Cl. ................... 333/195; 333/194; 310/313 D
[58] Field of Search ................... 333/193–196; 310/313 R, 313 A, 313 B, 313 C, 313 D

[56] References Cited

U.S. PATENT DOCUMENTS

| | | | |
|---|---|---|---|
| 4,166,258 | 8/1979 | Tseng | 333/196 |
| 4,365,219 | 12/1982 | Nathan | 333/194 |
| 4,734,664 | 3/1988 | Hikita et al. | 333/193 |
| 4,803,449 | 2/1989 | Hikita et al. | 333/193 |

FOREIGN PATENT DOCUMENTS

| | | |
|---|---|---|
| 0541284 | 5/1993 | European Pat. Off. |
| 5219044 | 2/1977 | Japan |
| 0143621 | 8/1983 | Japan |
| 0260908 | 10/1990 | Japan |

OTHER PUBLICATIONS

Smith et al., *IEEE Transaction on Microwave Theory and Techniques,* vol. MTT–20, No. 7, Jul. 1972, "Analysis and Design of Dispersui Interdigital Surfact-Wave Transducers".

Search Report for European Appl. 94117426.0, mailed Mar. 9, 1995.

Electronics Letters, 22 Oct. 1992, vol. 28, No. 22, pp. 2059–2054, Hikita et al., "Extended New-Type Saw-Resonalty-Coupled Filters Used in Duplexes for Japanese Cellular Radio".

*Primary Examiner*—Benny Lee
*Assistant Examiner*—Darius Gambino
*Attorney, Agent, or Firm*—Renner, Otto, Boisselle & Sklar

[57] ABSTRACT

In a surface acoustic wave (SAW) filter, on a 36° Y-cut X-propagation lithium tantalate substrate, series branch SAW resonators, which are connected in series between an input terminal and an output terminal, and parallel branch SAW resonators, which are connected between respective pairs of the series branch resonators by wirings and which are grounded, are provided. Two series branch resonators and one parallel branch resonator are connected in a T shape, so as to form a fundamental unit. In the SAW filter, three fundamental units are serially connected. An interdigital transducer (IDT) included in each resonator is made of a metal film containing aluminum as the main component. The thickness of the metal film is in the range of 8% to 10% of the electrode pitch of the IDT of the parallel branch resonator.

6 Claims, 8 Drawing Sheets

SURFACE ACOUSTIC WAVE FILTER WITH MULTIPLE GROUND TERMINALS

BACKGROUND OF THE INVENTION

1. Field of the Invention

The present invention relates to a surface acoustic wave (SAW) filter for exciting a surface acoustic wave on a substrate made of a piezoelectric material and for selectively passing a desired frequency band. More particularly, the present invention relates to a ladder-type SAW filter suitably used as an RF filter in mobile communication equipment.

2. Description of the Related Art

In recent years, SAW filters are increasingly in demand with the miniaturization of mobile communication equipment. The SAW filters are required to have superior characteristics of large stop band rejection as well as low loss. Among various types of SAW filters, ladder-type SAW filters are promising ones because the loss thereof can advantageously be made lower as compared with interdigitated interdigital transducer structure type SAW filters in which a plurality of input interdigital transducers (IDTs) and output IDTs are alternately disposed in a direction in which the surface acoustic wave propagates.

Conventional ladder-type SAW filters are described, for example, in Japanese Laid-Open Patent Publication No. 52-19044 or Japanese Laid-Open Patent Publication No. 5-183380.

Japanese Laid-Open Patent Publication No. 52-19044 is directed to a ladder-type SAW filter for realizing narrow-band filter characteristics of sufficiently narrow pass bandwidth and sufficiently large stop band rejection. For this purpose, the ladder-type SAW filter of the above publication has a construction in which a series branch and a parallel branch, each having an SAW resonator, are provided on a substrate made of a piezoelectric material (hereinafter referred to as a piezoelectric substrate). In addition, the ladder-type SAW filter is constructed so that the resonance frequency of the series branch resonator is made equal to the antiresonance frequency of the parallel branch resonator, so that an equal frequency is set to be the center frequency of the pass band. The narrow-band filter characteristics of sufficiently narrow pass bandwidth and sufficiently large stop band rejection are realized by setting the equivalent parallel capacitance of the parallel branch resonator larger than the equivalent parallel capacitance of the series branch resonator, and hence making the ratio of equivalent parallel capacitance larger than 1.

In the above-described construction for realizing the narrow-band filter, the stop band rejection can be made larger by increasing the ratio of equivalent parallel capacitance, while the bandwidth becomes narrower as the ratio of equivalent parallel capacitance is increased.

In the ladder-type SAW filter described in Japanese Laid-Open Patent Publication No. 5-183380, an inductance is additionally connected to the parallel branch resonator, so that the antiresonance frequency of the parallel branch resonator is shifted to the lower side. Accordingly, the bandwidth as one of the filter characteristics can be controlled by using a difference in frequency between the resonance frequency and the antiresonance frequency of the parallel branch resonator. Thus, the additional provision of the inductance makes it possible to widen the bandwidth, by increasing the difference in frequency between the resonance frequency and the antiresonance frequency.

In the above-described construction, in order to ensure a large stop band rejection, it is necessary to increase the ratio of the equivalent parallel capacitance or to increase the number of serially-connected ladder-type filters. However, since an inductance is additionally connected to the parallel branch resonator in series as described above, the electric resistance and inductance of the connecting wiring between SAW resonators on the piezoelectric substrate and wire bonding considerably affect the characteristics of the parallel branch resonator. As a result, the resonance frequency of the parallel branch resonator is also shifted to the lower side. Hence, a steep rise to the pass band cannot be obtained in the filter characteristics, and consequently, a satisfactory stop band rejection cannot be attained.

As described above, the conventional ladder-type SAW filters involve a difficulty in obtaining both a wide bandwidth and a sufficient stop band rejection.

SUMMARY OF THE INVENTION

The surface acoustic wave filter of this invention includes: a substrate made of a piezoelectric material; an input terminal and an output terminal provided on the substrate; and three fundamental resonator units serially connected between the input terminal and the output terminal on the substrate, wherein each of the three fundamental resonator units includes: a first surface acoustic wave resonator and a second surface acoustic wave resonator connected in series between the input terminal and the output terminal; and a third surface acoustic wave resonator connected between the first and the second surface acoustic wave resonators, the third surface acoustic wave resonator being grounded.

In one embodiment of the invention, the substrate is a 36° Y-cut X-propagation lithium tantalate substrate, and interdigital transducers included in the first, second, and third surface acoustic wave resonators are made of a metal film containing Al as a main component.

In another embodiment of the invention, a thickness of the metal film constituting the interdigital transducers has a value in the range of 8% to 10% of an electrode pitch of the interdigital transducer included in the third surface acoustic resonator.

In another embodiment of the invention, when an electrostatic capacitance of the interdigital transducers included in the first and the second surface acoustic wave resonators is indicated by Cs, and an electrostatic capacitance of the interdigital transducer included in the third surface acoustic wave resonator is indicated by Cp, value sets (Cs, Cp) of the Cs and Cp exist in a region (including a boundary thereof) defined by coordinates:

A: (Cs, Cp)=(2.00, 8.00)
B: (Cs, Cp)=(2.75, 5.09)
C: (Cs, Cp)=(4.32, 8.00), in a plane coordinate system having the Cs and Cp as coordinate axes, and a center frequency is in the range of 800 MHz to 1000 MHz.

In another embodiment of the invention, the surface acoustic wave filter further includes two ground terminals, wherein one of the two ground terminals is commonly used for grounding the third surface acoustic wave resonators included in two of the three fundamental resonator units, and the other ground terminal is used for grounding the third surface acoustic wave resonator included in the remaining one fundamental resonator unit.

In another embodiment of the invention, a wiring for connecting the third surface acoustic wave resonator to the first and the second surface acoustic wave resonators has a width of 50 μm or more.

In another embodiment of the invention, an area of each of the input terminal and the output terminal is 0.14 mm² or less.

Thus, the invention described herein makes possible the advantage of providing a ladder-type SAW filter with large stop band rejection and wide bandwidth.

This and other advantages of the present invention will become apparent to those skilled in the art upon reading and understanding the following detailed description with reference to the accompanying figures.

DESCRIPTION OF THE PREFERRED EMBODIMENTS

Hereinafter the present invention will be described by way of illustrative examples with reference to the accompanying drawings.

Figure 1:
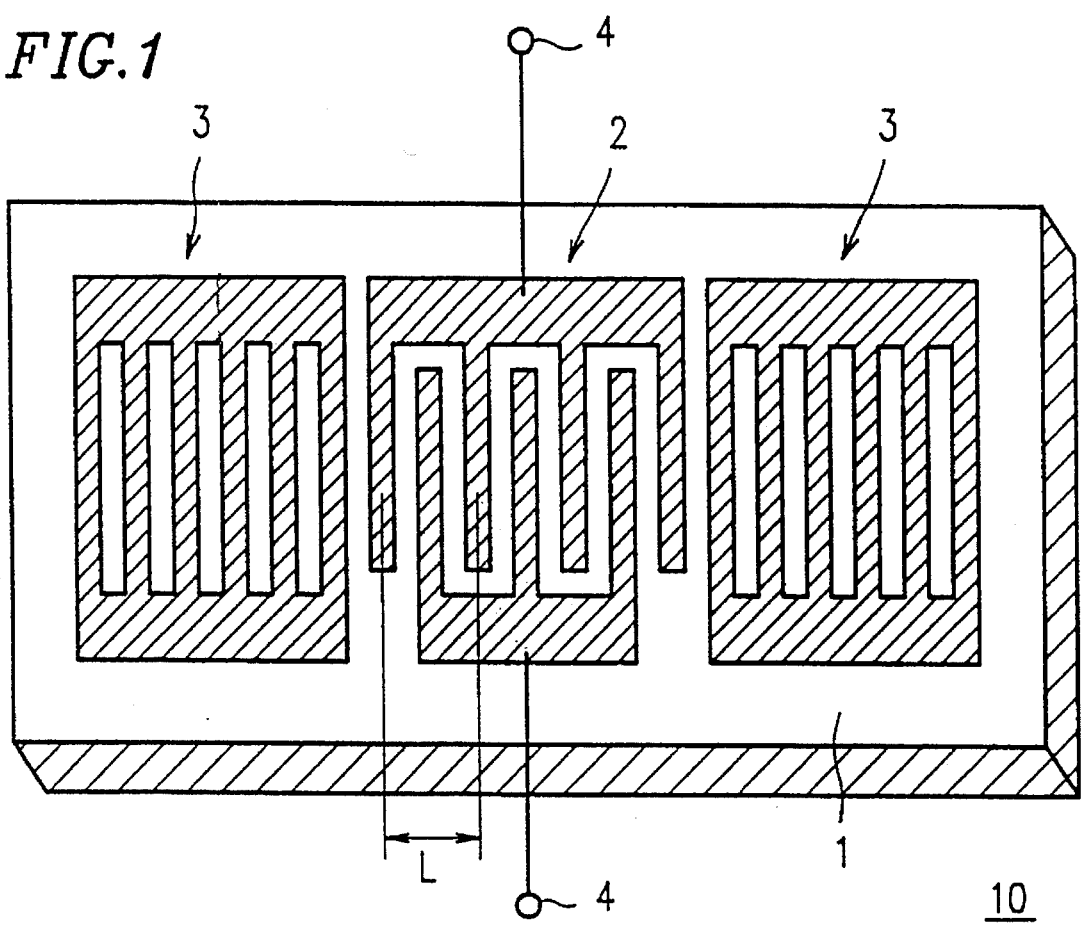
FIG. 1 is a diagram schematically showing the structure of an SAW resonator used in one embodiment of the invention.

FIG. 1 schematically shows the structure of a surface acoustic wave (SAW) resonator 10 used in this invention. The SAW resonator 10 includes an interdigital transducer (hereinafter referred to as IDT) 2 and two reflectors 3 which are provided on both sides of the IDT 2 on a piezoelectric substrate 1. The IDT 2 has an input electrode and an output electrode, and input/output terminals 4 are respectively connected thereto. In the case where the electrode pitch of the IDT 2 is set to be L (see FIG. 1), the IDT 2 excites a surface acoustic wave having a wavelength substantially equal to L by applying a high-frequency signal to the IDT 2 through the terminals 4. The excited surface acoustic wave is confined between the reflectors 3, so as to be a standing wave which results in the resonance phenomenon. The SAW resonator 10 utilizes the resonance phenomenon of the acoustic wave.

Figure 2:
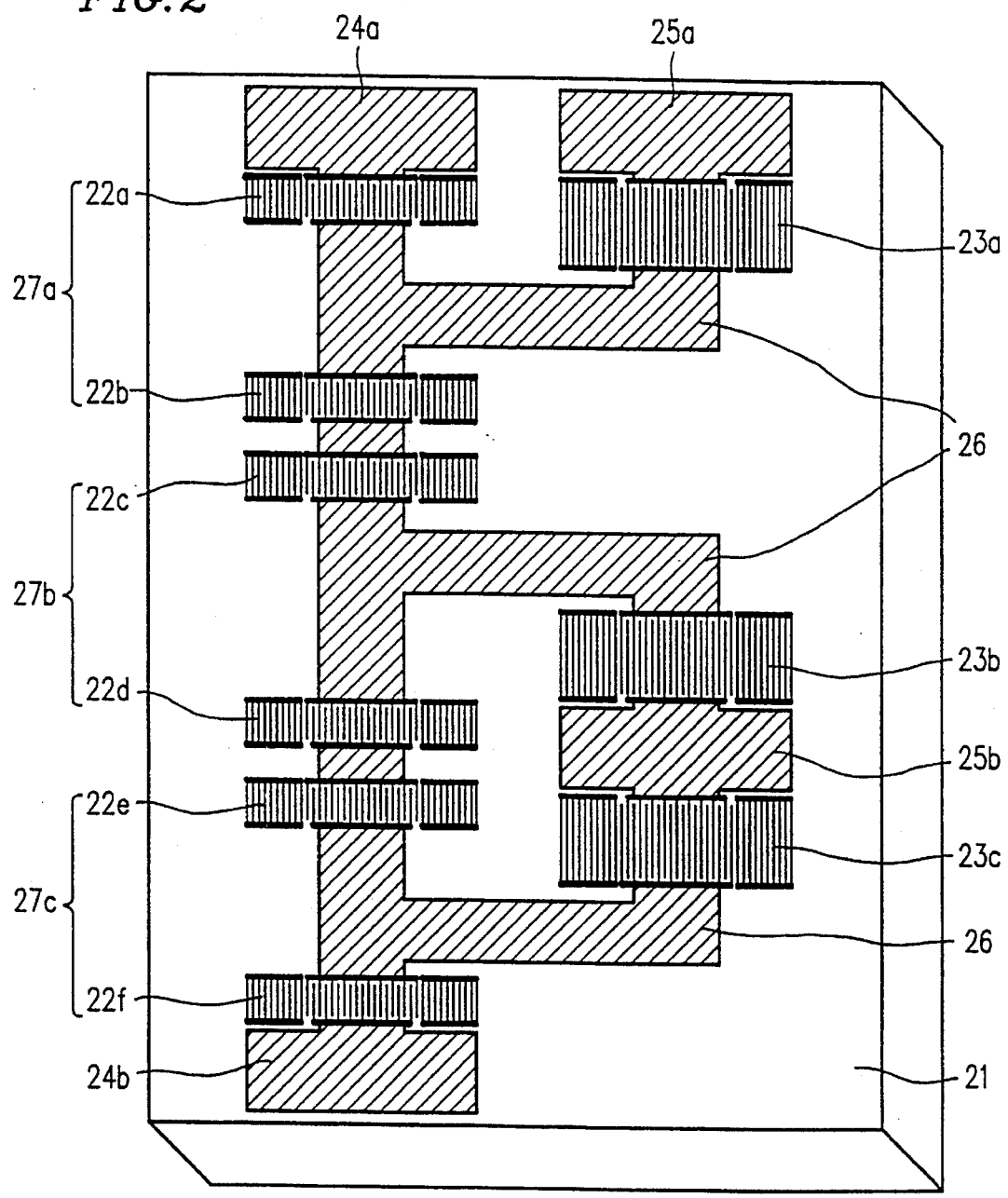
FIG. 2 is a diagram schematically showing the structure of a ladder-type SAW filter in one embodiment of the invention.

FIG. 2 shows the structure of a ladder-type SAW filter 20 in one embodiment of the invention. In the ladder-type SAW filter 20, series branch resonators 22a–22f, and parallel branch resonators 23a–23c are provided on a piezoelectric substrate 21. Each of the resonators 22a–22f, 23a–23c is an SAW resonator 10 having the above-described construction in which the IDT 2 is interposed between the two reflectors 3, as shown in FIG. 1. In the following description, when the series branch resonators 22a–22f are collectively referred, they are designated by the reference numeral 22. The same collective designation may be conducted for other various components.

The series branch resonators 22 are connected in series. The first and last resonators 22a and 22f are connected to an input terminal 24a and an output terminal 24b, respectively. Each of the parallel branch resonators 23 is connected between two series branch resonators 22 of the corresponding pair via a wiring 26, and is grounded through a ground terminal 25. Although not shown, wirings are connected to the input/output terminals 24 and the ground terminals 25, respectively, by wire bonding.

In the above-described construction, two series branch resonators 22 and one parallel branch resonator 23 are connected in the shape of T, so as to constitute a fundamental unit 27. Accordingly, there are three fundamental units 27a, 27b, and 27c which are serially connected. Specifically, the series branch resonators 22a and 22b and the parallel branch resonator 23a constitute the first fundamental unit 27a. Similarly, the series branch resonators 22c and 22d and the parallel branch resonator 23b constitute the second fundamental unit 27b, and the series branch resonators 22e and 22f and the parallel branch resonator 23c constitute the third fundamental unit 27c.

In the construction shown in FIG. 2, among the ground terminals 25 included in the respective fundamental units 27, the ground terminal 25a of the first fundamental unit 27a is independently provided. For the second and the third fundamental units 27b and 27c, a common ground terminal 25b is provided, for the following reason.

As described above, the wirings are connected to the ground terminals 25 by wire bonding. Such a wiring inevitably has inductance, and the inductance may affect the filter characteristics. If the ground terminals 25 are independently provided for the respective fundamental units 27, the wire bonding is performed for each of the ground terminals 25. As a result, the value of inductance additionally connected may vary for the respective fundamental units 27. Accordingly, in order to obtain required filter characteristics, it is desirable to provide a common ground terminal 25 for all of the fundamental units 27, thereby making the influence of the wire-bonded wiring on the filter characteristics equal for the respective fundamental units 27.

However, if all of the ground terminals 25 are formed as a common ground terminal, the wiring pattern on the piezoelectric substrate 21 becomes complicated, and the length of the wiring is increased. The complicated wiring pattern is disadvantageous in terms of the simplification of production process and the cost reduction. In addition, the increase in length of the wiring results in the increase in resistive component which prevents the desired filter characteristics to be obtained.

Therefore, considering the above-mentioned tradeoff factors, in the ladder-type SAW filter 20 shown in FIG. 2 in which three fundamental units 27 are serially connected, it is preferred that two of the three fundamental units 27 are provided with one common ground terminal 25 and the remaining one fundamental unit is provided with one independent ground terminal 25. In the structure shown in FIG. 2, the ground terminal 25a for the first fundamental unit 27a is independently provided, and the ground terminal 25b is commonly provided for the second and third fundamental units 27b and 27c. However, the structure is not limited to this specific one. It is appreciated that other combinations can be adopted depending on the design of the whole filter. For example, one ground terminal for the third fundamental unit 27c may be independently provided, and one common ground terminal may be provided for the first and second fundamental units 27a and 27b.

In the ladder-type SAW filter 20 using the SAW resonators 10, the stop band rejection is determined by the ratio Cr (=Cp/Cs) of the IDT electrostatic capacitance Cp of the parallel branch resonator 23 to the IDT electrostatic capacitance Cs of the series branch resonator 22, and by the number of serially-connected fundamental units 27.

Figure 3:
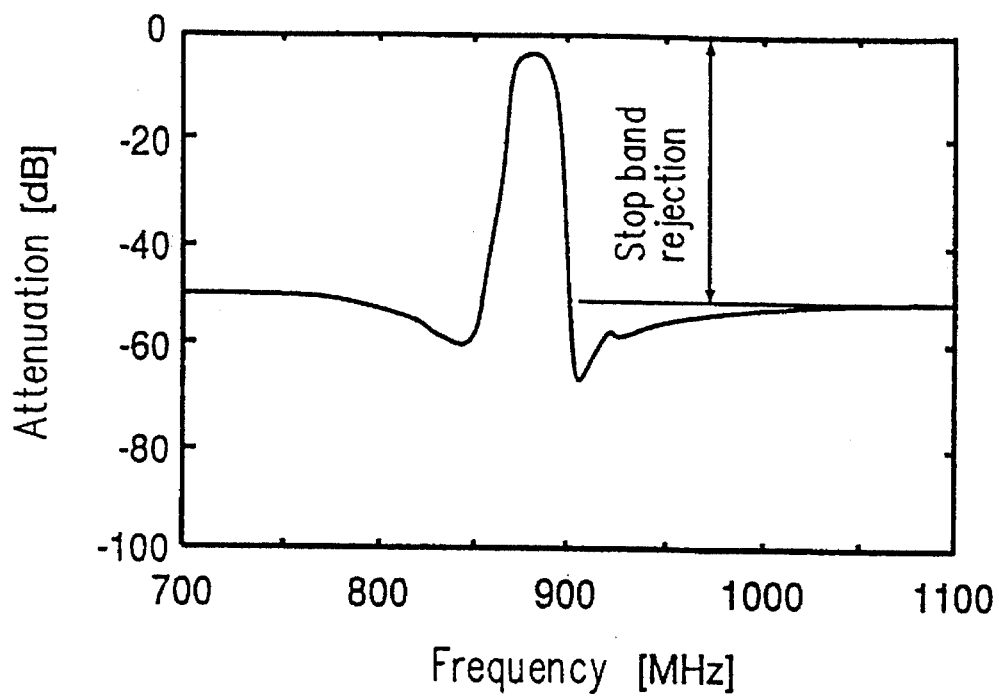
FIG. 3 is a graph depicting the frequency characteristic of the ladder-type SAW filter in one embodiment of the invention.

FIG. 3 shows the frequency characteristic (the relationship between the frequency and the attenuation) of the ladder-type SAW filter 20 shown in FIG. 2, in the case where a 36° Y-cut X-propagation lithium tantalate substrate is used as the piezoelectric substrate 21, and the respective resonators 22 and 23 are formed to have an electrostatic capacitance ratio of Cr=2.5. As is apparent from FIG. 3, a stop band rejection of −50 dB can be obtained in this case.

Figure 4:
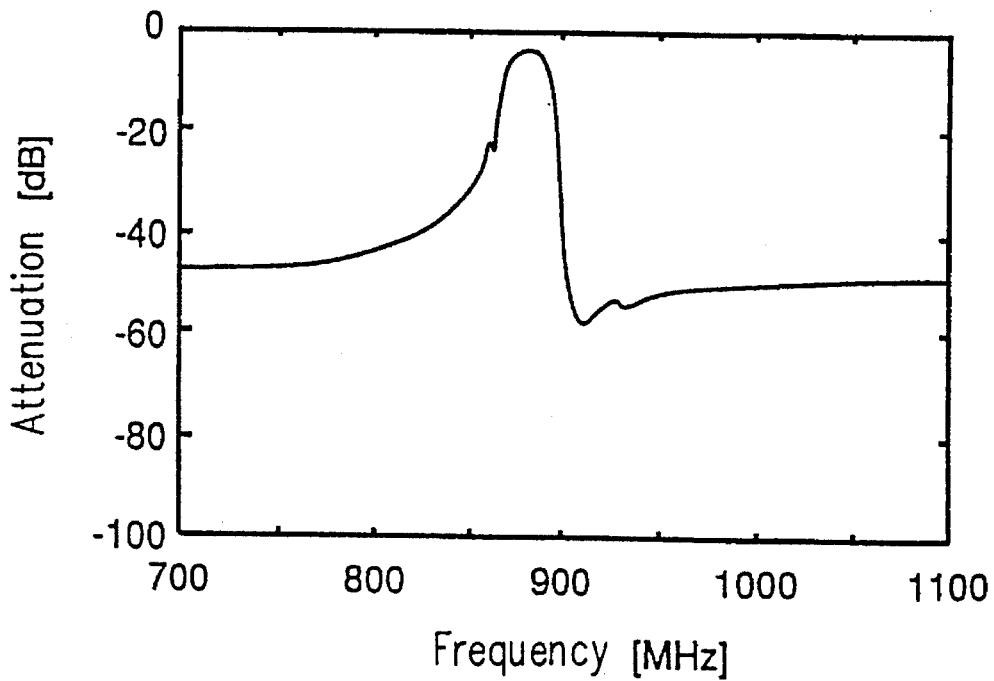
FIG. 4 is a graph depicting the frequency characteristics of a conventional ladder-type SAW filter.

FIG. 4 shows the frequency characteristic of a conventional ladder-type SAW filter in which the series branch resonators and the parallel branch resonators are alternately connected, in the case where the electrostatic capacitance ratio Cr is set to be 2.5, and the stop band rejection of −50 dB is ensured. In the conventional structure, in order to obtain the characteristic shown in FIG. 4, it is necessary to connect four pairs of series branch resonators and parallel branch resonators (as a whole, four series branch resonators and four parallel branch resonators). However, in such connection, the number of parallel branch resonators is larger than that in the embodiment of the invention, so that filter characteristics may be affected significantly by inductance which is equivalently connected to each parallel branch resonator due to the connecting wirings between the resonators, the wire bonding, and the like. As a result, as shown in FIG. 4, in a lower-frequency range than the pass band, a steep rise to the pass band cannot be obtained, and spurious response may appear.

In the SAW filter 20 of this embodiment shown in FIG. 2, the above-described problems of the prior art cannot be caused, and sufficient stop band rejection can be ensured. In the description, the 36° Y-cut X-propagation lithium tantalate substrate is used as the piezoelectric substrate. Alternatively, when a lithium niobate substrate or a lithium borate substrate is used, the same effects can be obtained. In order to obtain the best characteristics for an RF filter used in mobile communication, the 36° Y-cut X-propagation lithium tantalate substrate can most suitably be used, in view of the velocity of acoustic wave propagating on the substrate, the electromechanical coupling factor, the temperature characteristic, and the like.

As the material for the IDT 2 of the SAW resonator 10, a metal film containing aluminum as the main component with low electric resistance and low density (hereinafter referred to as an Al film) is used. The reflection coefficient of the surface acoustic wave at the electrode end and the substantial electromechanical coupling factor depend on the thickness of the Al film, so that the difference in frequency between the resonance and the antiresonance frequencies of a resonator is varied depending on the thickness of the Al film. As the thickness of the Al film is increased, the substantial electromechanical coupling factor increases, and hence the frequency difference is increased. Therefore, the bandwidth of a filter can be widened by increasing the thickness of the Al film.

In general, mobile communication equipment requires an RF filter having good cut-off characteristic, because there are receiving and transmission bands. For example, as an exemplary standard of the mobile communication in 800-MHz band, there is a domestic analog standard in Japan. In this standard, the receiving band is in the range of 860 MHz to 885 MHz, and the transmission band is in the range of 915 MHz to 940 MHz. The interval between the receiving band and the transmission band is 30 MHz. Hereinafter, the features of the SAW filter 20 of this embodiment is further described in an example case where the filter is used as a receiving filter for the above Japanese domestic analog standard.

Figure 5:
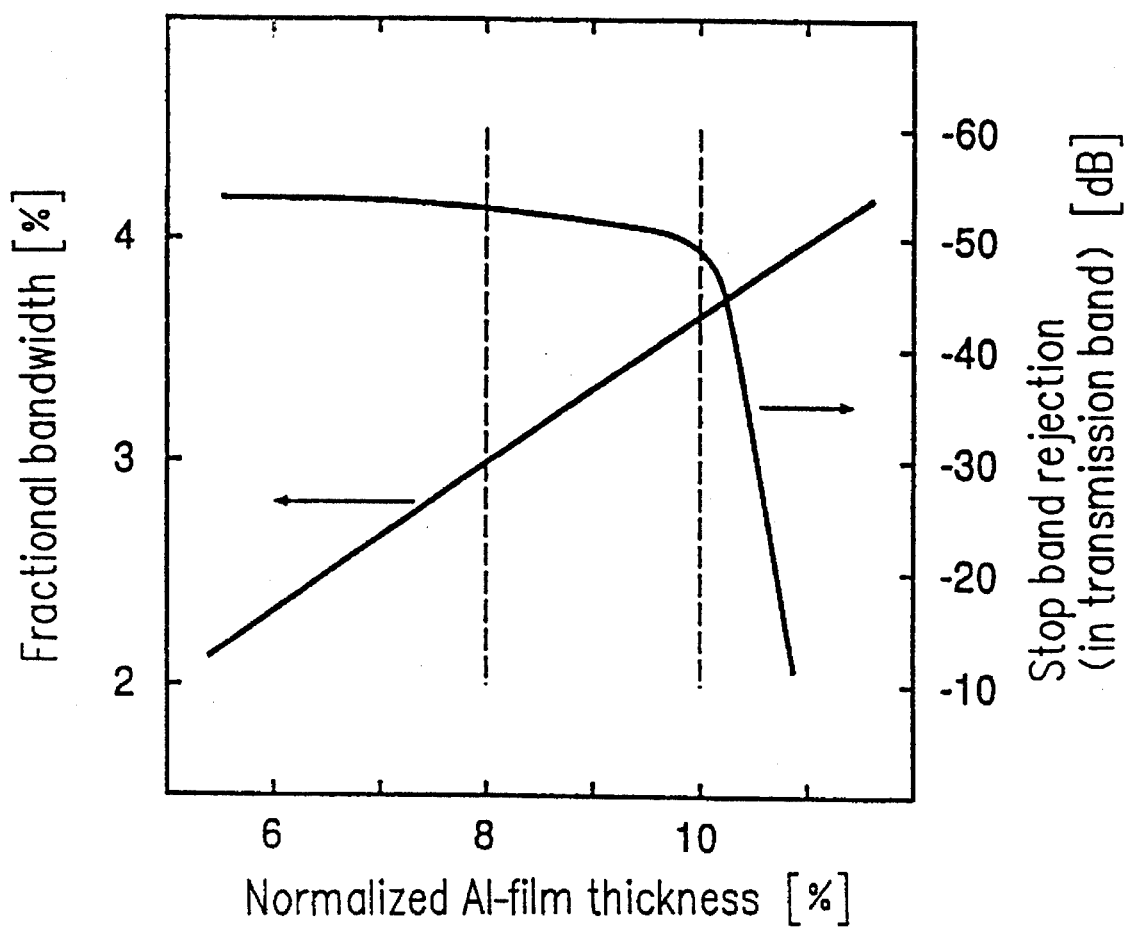
FIG. 5 is a graph depicting the relationship between the Al-film thickness and the fractional band-width of the ladder-type SAW filter, and the relationship between the Al-film thickness and the stop band rejection in the transmission band in one embodiment of the invention.

FIG. 5 shows the relationship between the normalized Al-film thickness (the Al film thickness/the electrode pitch of the IDT of the parallel branch resonator 23) and the fractional bandwidth (the bandwidth/the center frequency), and the relationship between the normalized Al-film thickness and the stop band rejection in the transmission band. The bandwidth is defined at a point where the insertion loss is lower than the minimum insertion loss in the pass band by 1 dB.

It is seen from FIG. 5 that as the Al-film thickness is increased, the bandwidth is widened. The receiving filter of the Japanese domestic analog standard has a center frequency of 872.5 MHz, and a bandwidth of 25 MHz, and satisfies the requirements if the fractional bandwidth is 3% or more. Therefore, as for the Al-film thickness, it is sufficient that the normalized Al-film thickness is 8% or more.

Figure 6:
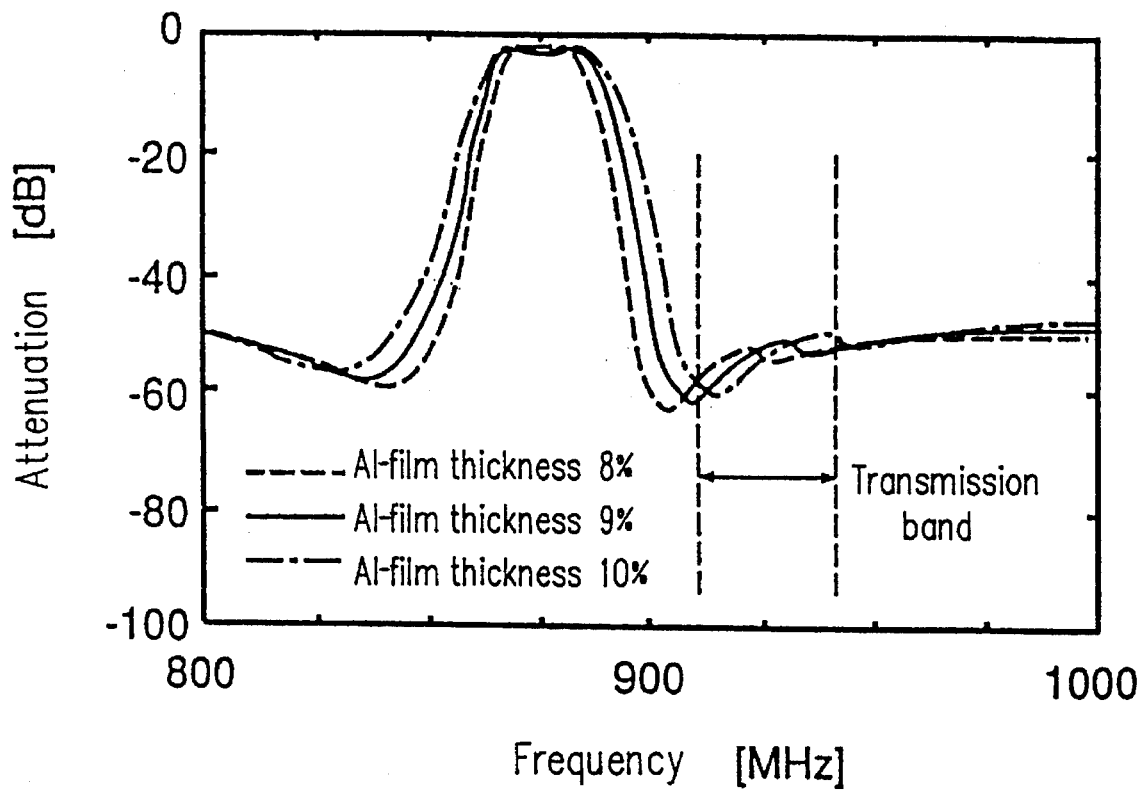
FIG. 6 is a graph illustrating the influence of the Al-film thickness on the frequency characteristic of the ladder-type SAW filter in one embodiment of the invention.

Also, it is seen from FIG. 5 that as the Al-film thickness is increased, the stop band rejection in the transmission band is decreased. The reasons are described with reference to FIG. 6. FIG. 6 shows the influence of the Al-film thickness on the frequency characteristic of the ladder-type SAW filter 20 in one embodiment of the invention. In FIG. 6, the Al-film thickness is indicated as the normalized Al-film thickness, and the characteristics in the cases of 8%, 9%, and 10% are depicted. As is seen from FIG. 6, as the Al-film thickness is increased, the pass band is widened, but the difference in frequency between the stop bands on both sides of the pass band is increased. Accordingly, the cut-off characteristic is deteriorated, and the stop band rejection is drastically decreased. As is shown in FIG. 6, the transmission band corresponds to a frequency range slightly higher than the pass band, but the side lobe from the pass band to the higher-frequency side extends into the transmission band. Accordingly, it is impossible to ensure sufficient attenuation in this region, and such insufficient attenuation may result in noise. In order to eliminate such a problem, it is desired that the normalized Al-film thickness is set to be 10% or less.

As described above, the optimum Al-film thickness is defined in the range of 8% to 10% in the normalized film thickness. For other standards utilizing the 800-MHz band such as AMPS used in North America and GSM used in Europe, the same degree of filter characteristic as that of the above-described Japanese domestic analog standard is required, although the center frequency is different. In such a case, by appropriately setting the normalized Al-film thickness in the above-mentioned range, good filter characteristics can also be obtained.

Figure 7:
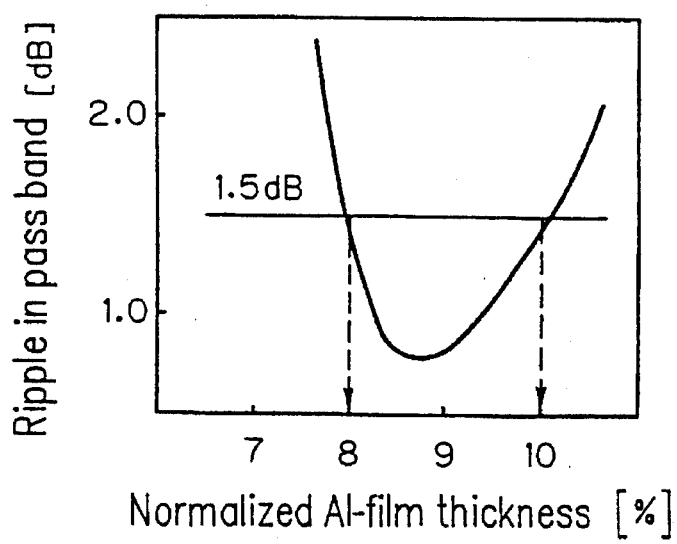
FIG. 7 is a graph illustrating the relationship between the Al-film thickness and the ripple in the pass band of the ladder-type SAW filter in one embodiment of the invention.

FIG. 7 shows the relationship between the normalized Al-film thickness and the ripple in the pass band in the case where the fractional bandwidth required for the mobile communication equipment RF filter for the 800-MHz band is 3.7%, with respect to the ladder-type SAW filter 20 in this example shown in FIG. 2 using the 36° Y-cut X-propagation lithium tantalate substrate 21. It is apparent from the relationship that the ripple in the pass band has a minimal value when the normalized Al-film thickness is approximately 9%. In addition, if the normalized Al-film thickness is in the above-mentioned range of 8% to 10%, the ripple in the pass band can be 1.5 dB or less, which is acceptable. Therefore, the above-mentioned range of the normalized Al-film thickness is also effective with regard to the reduction of the ripple in the pass band.

Figure 8:
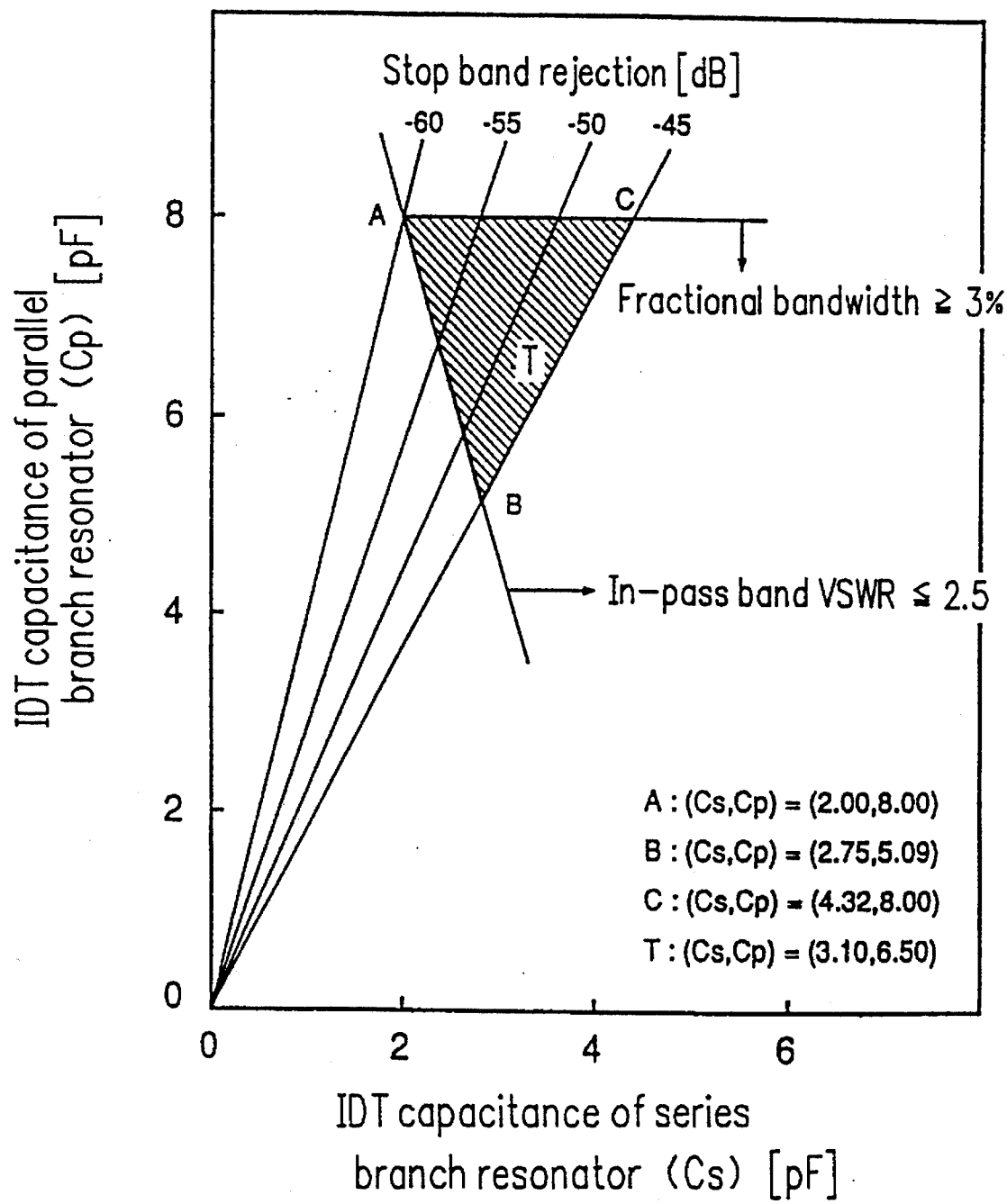
FIG. 8 is a diagram illustrating the relationship between the stop band rejection and the IDT electrostatic capacitance of the series branch resonator and the IDT electrostatic capacitance of the parallel branch resonator of the ladder-type SAW filter in one embodiment of the invention.

FIG. 8 shows the relationship between the stop band rejection, and the IDT electrostatic capacitance Cs of the series branch resonator and the IDT electrostatic capacitance Cp of the parallel branch resonator, in the case where the ladder-type SAW filter 20 of this embodiment using the 36° Y-cut X-propagation lithium tantalate substrate 21 is produced so as to have a normalized Al-film thickness of 9%. This is the simulation in an equivalent circuit in which the second model of Smith based on the description in IEEE Trans. MTT20(7) (1972) pp. 458–471 is slightly modified.

In general, parameters which affect filter characteristics include in-pass band VSWR (voltage standing wave ratio) in addition to the above-described stop band rejection and the fractional bandwidth. Herein, the in-pass band VSWR is a parameter representing the reflective characteristic of the filter. When the value of the in-pass band VSWR is 1, it means that there is no reflection. Therefore, as the value of the in-pass band VSWR becomes closer to 1, it is determined that the filter has better characteristics with less reflection.

The specifications on characteristics required for filters in practical use depend on the design of the apparatus in which each filter is used. In general, the required specifications can be realized by a stop band rejection of −45 dB or more, a fractional bandwidth of 3% or more, and an in-pass band VSWR of 2.5 or less. In FIG. 8, the above-mentioned range corresponds to the area (including the boundary) enclosed by three points having the coordinate values represented by the following expressions:

A: (Cs, Cp)=(2.00, 8,00)

B: (Cs, Cp)=(2.75, 5,09)

C: (Cs, Cp)=(4.32, 8.00)

Accordingly, if the ladder-type SAW filter 20 is constructed so that Cs and Cp have the values in the above-specified range, the characteristics required for the mobile communication equipment RF filter for 800-MHz band can be satisfied.

Figure 9:
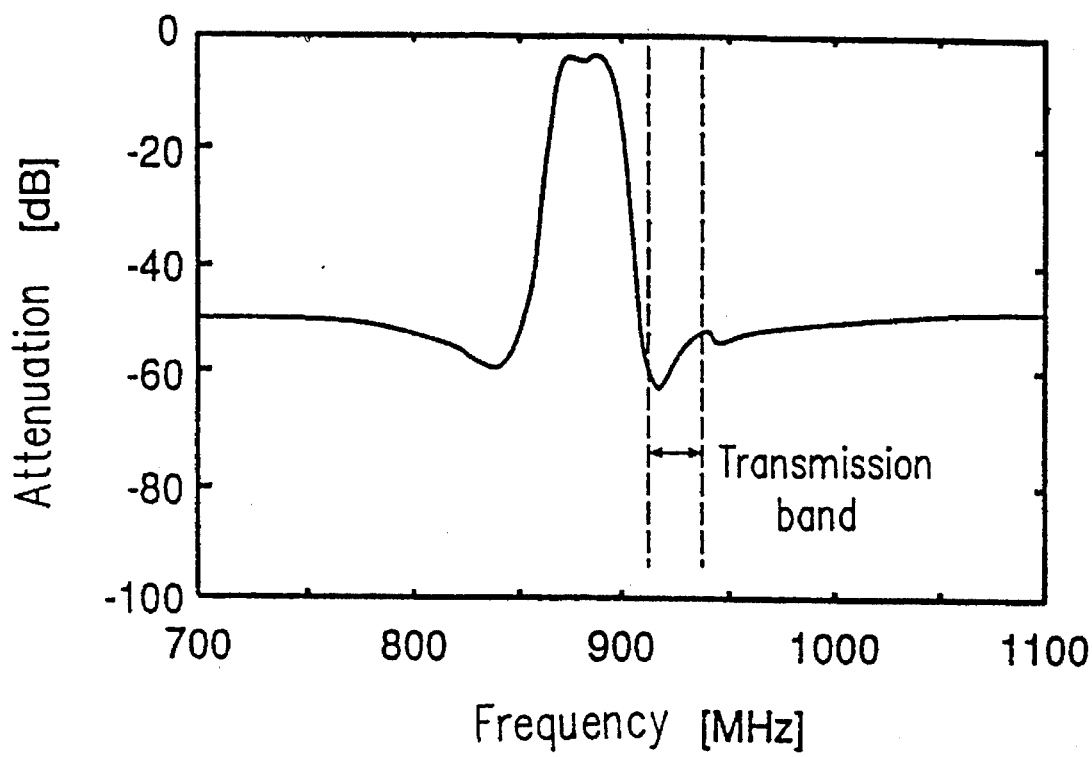
FIG. 9 is a graph showing the frequency characteristic of the ladder-type SAW filter in one embodiment of the invention.

FIG. 9 shows the frequency characteristic of the ladder-type SAW filter 20 which is produced so that the IDT electrostatic capacitances of the resonators 22 and 23 satisfy the values at point T in FIG. 8, i.e., (Cs, Cp)=(3.1, 6.5). Specifically, in the series branch resonator 22, the electrode pitch of the IDT is 4.408 μm, the length of aperture is 55.10 μm, and the number of IDT pairs is 120; and in the parallel branch resonator 23, the electrode pitch of the IDT is 4.612 μm, the length of aperture is 138.36 μm, and the number of IDT pairs is 100. In such a case, the center frequency of the pass band is 872.5 MHz, the bandwidth is 31 MHz, the in-pass band VSWR is 2.2. Thus, the stop band rejection in the transmission band is −50 dB, so that the stop band rejection is large and the ripple in the pass band is small in the obtained frequency characteristic.

The resonance characteristic of the SAW filter 20 varies depending on electric resistance and inductance of the connecting wiring 26 between the resonators 22 and 23, and the wiring by wire bonding. Especially when the inductance which is equivalently connected to the resonator is increased, the resonance frequency of the resonator is shifted to be lower. However, the resonance frequency of the parallel branch resonator 23 is the stop band on the lower-frequency side of the pass band. Accordingly, if the inductance is increased, the cut-off characteristic of the ladder-type SAW filter 20 is deteriorated, and the steep rise to the pass band cannot be obtained in the frequency characteristic. In addition, when electric resistance in association with the parallel branch resonator 23 is increased, the resonance resistance at the resonance frequency is increased and hence the stop band disappears.

The connecting wiring 26 which connects the parallel branch resonator 23 to the series branch resonator 22 shown in FIG. 2 is an Al film having a thickness of 0.4 μm because it is formed simultaneously with the formation of the resonators 22 and 23, while the connecting wiring 26 is required to have a length of 500 μm or more for achieving the connection. Therefore, it is necessary to increase the width of the connecting wiring 26 for reducing the electric resistance and inductance thereof.

Figure 10:
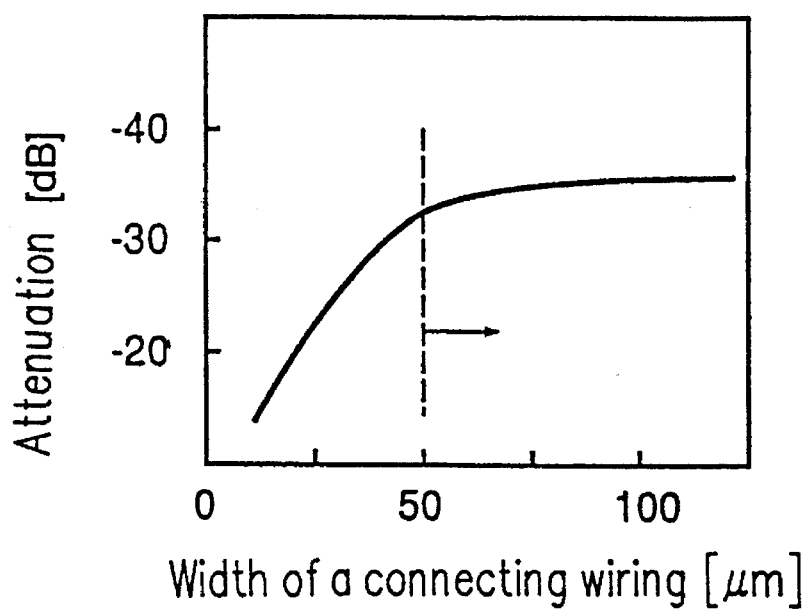
FIG. 10 is a graph showing the relationship between the width of a connecting wiring for connecting the resonators and the stop band rejection of the ladder-type SAW filter in one embodiment of the invention.

FIG. 10 shows the relationship between the width of the connecting wiring 26 and the attenuation at a frequency lower than the pass band by 30 MHz in the structure shown in FIG. 2. The length of the connecting wiring 26 is 500 μm. If the width of the connecting wiring 26 is larger than 50 μm, the attenuation is converged at 35 dB. If the width of the connecting wiring 26 is smaller than 50 μm, the inductance is increased and the attenuation is drastically reduced. Therefore, the connecting wiring 26 is required to have a width of at least 50 μm.

On the other hand, at the input/output terminals 24, capacitance against a ground is generated via the substrate 21. When such capacitance against the ground at the input/output terminals 24 is increased, the ripple in the pass band is increased. In an RF filter for mobile communication equipment, it is desired that the ripple in the pass band is as small as possible, and the maximum allowable ripple in the pass band is usually 1.5 dB or less.

Figure 11:
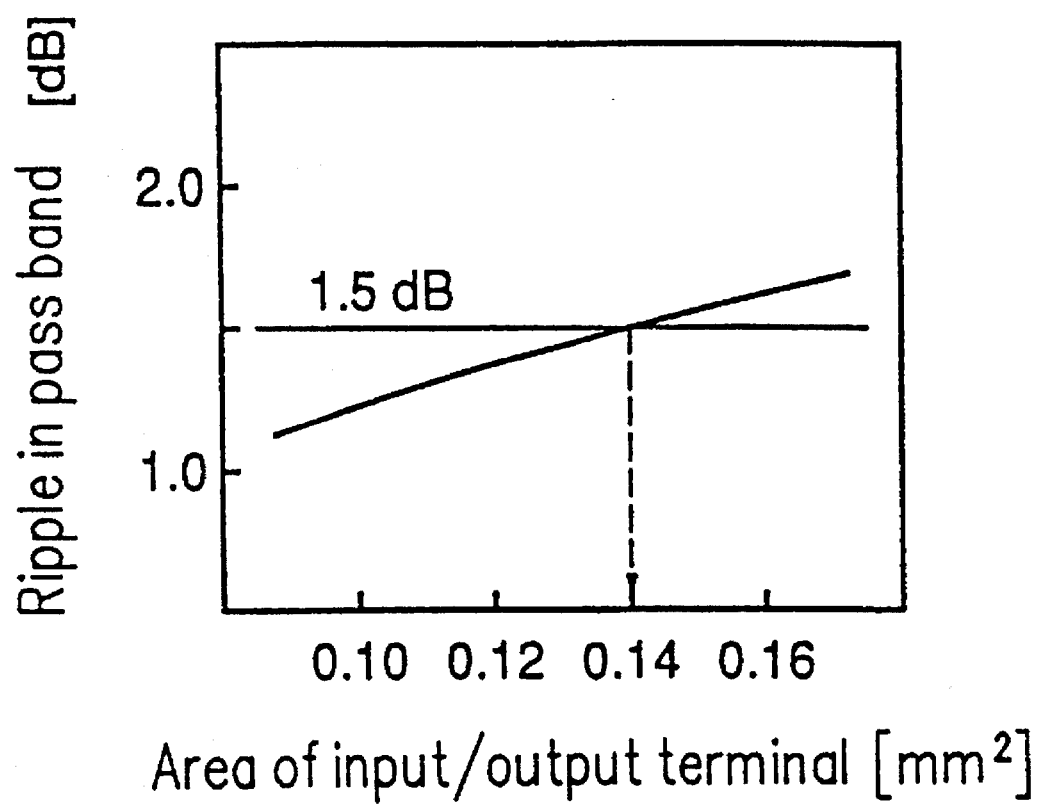
FIG. 11 is a graph showing the relationship between the area of input/output terminals and the ripple in the pass band of the ladder-type SAW filter in one embodiment of the invention.

FIG. 11 shows the relationship between the area of each of the input/output terminals 24 and the ripple in the pass band. As is seen from FIG. 11, when the area of each of the input/output terminals 24 is 0.14 mm$^2$ or less, the ripple in the pass band has an acceptable value of 1.5 dB or less. However, in each of the input/output terminals 24, a side thereof has a length of 150 μm or more for connecting the wiring by wire bonding.

As described above, the ladder-type SAW filter 20 having the structure of this embodiment can realize superior frequency characteristic such as small ripple in pass band and sufficient stop band rejection, as compared with the conventional ladder-type SAW filter.

In the description of this embodiment, three fundamental units 27 of the ladder-type SAW filter 20 are serially connected. However, the number of fundamental units is not limited to this specific value. For example, the two fundamental units 27 may be serially connected so as to constitute a ladder-type SAW filter. Such a ladder-type SAW filter is inferior in stop band rejection, but is not disadvantageous in bandwidth and ripple in the pass band in the ranges of electrode thickness and IDT electrostatic capacitances mentioned in this embodiment, as compared with the case of the three serially connected fundamental units 27 described in this embodiment.

Alternatively, the last one of the serially connected fundamental units 27 may have, instead of the T-shaped structure, a structure in which one series branch resonator 22 and one parallel branch resonator 23 are connected. In other words, the last series branch resonator 22 in the T-shaped structure can be omitted.

In the ladder-type SAW filter 20 of this embodiment shown in FIG. 2, the shape of each of the input/output terminals 24 and the ground terminals 25 are rectangular. It is appreciated that each terminal may have any other shape such as a circular shape.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A surface acoustic wave filter comprising:

a substrate made of a piezoelectric material;

an input terminal and an output terminal provided on the substrate; and three fundamental resonator units serially connected between the input terminal and the output terminal on the substrate, wherein each of the three fundamental resonator units includes:

a unit input and a unit output;

a first surface acoustic wave resonator and a second surface acoustic wave resonator connected in series via a respective unit input and a respective unit output between the input terminal and the output terminal;

a third surface acoustic wave resonator connected between the first and the second surface acoustic wave resonators, the third surface acoustic wave resonator being grounded; and further comprising two ground terminals, wherein one of the two ground terminals is commonly used for grounding the third surface acoustic wave resonators included in two of the three fundamental resonator units, and the other ground terminal is used for grounding the third surface acoustic wave resonator included in the remaining one fundamental resonator unit.

2. A surface acoustic wave filter according to claim 1, wherein the substrate is a 36° Y-cut X-propagation lithium tantalate substrate, and interdigital transducers included in the first, second, and third surface acoustic wave resonators are made of a metal film containing Al as a main component.

3. A surface acoustic wave filter according to claim 2, wherein a thickness of the metal film constituting the interdigital transducers has a value in the range of 8% to 10% of an electrode pitch of the interdigital transducer included in the third surface acoustic resonator.

4. A surface acoustic wave filter according to claim 3, wherein, when an electrostatic capacitance of the interdigital transducers included in the first and the second surface acoustic wave resonators is indicated by Cs, and an electrostatic capacitance of the interdigital transducer included in the third surface acoustic wave resonator is indicated by Cp, value sets (Cs, Cp) of the Cs and Cp exist in a region (including a boundary thereof) defined by coordinates A, B and C as follows:

A: (Cs, Cp)=(2.00, 8.00)

B: (Cs, Cp)=(2.75, 5.09)

C: (Cs, Cp)=(4.32, 8.00), in a plane coordinate system having the Cs and Cp as coordinate axes, and a center frequency is in the range of 800 MHz to 1000 MHz.

5. A surface acoustic wave filter according to claim 1, wherein an area of each of the input terminal and the output terminal is 0.14 mm$^2$ or less.

6. A surface acoustic wave filter according to claim 1, wherein a wiring for connecting the third surface acoustic wave resonator to the first and the second surface acoustic wave resonators has a width of 50 μm or more.

* * * * *

UNITED STATES PATENT AND TRADEMARK OFFICE
CERTIFICATE OF CORRECTION

PATENT NO. : 5,506,552
DATED : April 9, 1996
INVENTOR(S) : Shun-ichi Seki; Kazuo Eda; Yutaka Taguchi; Keiji Onishi It is certified that error appears in the above-indentified patent and that said Letters Patent is hereby corrected as shown below:

Column 2, line 37, delete "A1" and substitute --Al--.

Column 6, line 32, delete "A1" and substitute --Al--.

Column 10 in claim 2, line 5, delete "A1" and substitute --Al--.

Signed and Sealed this

Nineteenth Day of November, 1996

Attest:

BRUCE LEHMAN

Attesting Officer    Commissioner of Patents and Trademarks